(12) United States Patent
Emoto

(10) Patent No.: US 7,388,307 B2
(45) Date of Patent: Jun. 17, 2008

(54) STAGE APPARATUS, PLANE MOTOR, AND DEVICE MANUFACTURING METHOD

(75) Inventor: Keiji Emoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 391 days.

(21) Appl. No.: 11/126,365

(22) Filed: May 11, 2005

(65) Prior Publication Data

US 2005/0253463 A1 Nov. 17, 2005

(30) Foreign Application Priority Data

May 17, 2004 (JP) .............................. 2004-146641

(51) Int. Cl.
*H02K 41/00* (2006.01)
(52) U.S. Cl. ........................................................ 310/12
(58) Field of Classification Search .................. 310/12, 310/15, 16, 179, 208; 355/30, 53, 72, 75
See application file for complete search history.

(56) References Cited

U.S. PATENT DOCUMENTS

| 3,958,138 | A | * | 5/1976 | Eastham et al. | ............... | 310/13 |
| 5,925,956 | A | * | 7/1999 | Ohzeki | ....................... | 310/90.5 |
| 5,959,415 | A | * | 9/1999 | Sedgewick et al. | ......... | 318/135 |
| 6,445,093 | B1 | | 9/2002 | Binnard | ........................ | 310/12 |
| 6,452,292 | B1 | | 9/2002 | Binnard | ........................ | 310/12 |
| 6,972,499 | B2 | * | 12/2005 | Emoto | ........................... | 310/12 |
| 7,038,759 | B2 | * | 5/2006 | Emoto et al. | .................. | 355/30 |
| 7,057,703 | B2 | * | 6/2006 | Emoto et al. | .................. | 355/30 |
| 7,218,020 | B2 | * | 5/2007 | Emoto | ........................... | 310/12 |

FOREIGN PATENT DOCUMENTS

JP     2002-112526     4/2002

\* cited by examiner

*Primary Examiner*—Tran Nguyen
(74) *Attorney, Agent, or Firm*—Fitzpatrick, Cella, Harper & Scinto

(57) ABSTRACT

A stage apparatus includes a movable element including a plurality of magnets, a stage fixed to the movable element, and a stator configured with layers of coils arranged opposite to the magnets with a gap, in which (i) respective layers of coils serve as a plurality of driving axes for driving the movable element in two-dimensional directions, (ii) the stage apparatus generates a driving force in the movable stage by applying power to coils corresponding to respective layers, (iii) a conductive area of a section having a normal coil in a coil winding direction is made so that heat generation amounts of coils corresponding to the respective layers are substantially equal, and (iv) the conductive area of the section having a normal in the coil winding direction in the respective layers of coils is made relatively larger than coils having a smaller driving force constant.

10 Claims, 13 Drawing Sheets

TOP BOARD 22

21 MAGNET ARRAY

L MAGNET CYCLE

DEFECTIVE PORTION

DEFECTIVE PORTION

HORIZONTALLY MAGNETIZED MAGNET

VERTICALLY MAGNETIZED MAGNET

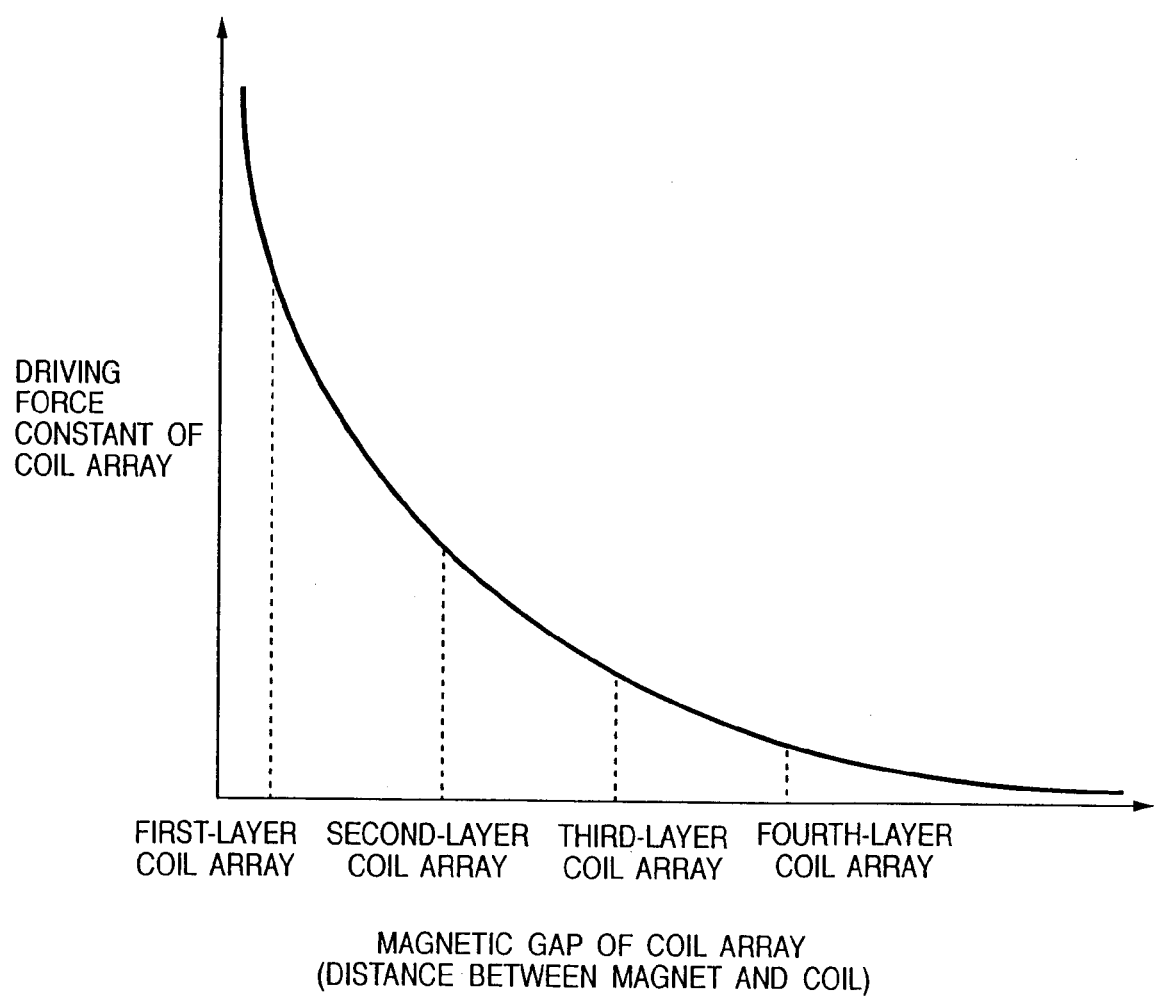

SEMICONDUCTOR DEVICE MANUFACTURING FLOW

STAGE APPARATUS, PLANE MOTOR, AND DEVICE MANUFACTURING METHOD

FIELD OF THE INVENTION

This application claims priority from Japanese Patent Application No. 2004-146641 filed on May 17, 2004, which is hereby incorporated by reference herein.

The present invention relates to a stage apparatus having, as a driving source, a plane motor, for moving an object in two-dimensional directions.

BACKGROUND OF THE INVENTION

A construction of a conventional plane motor is described with reference to FIG. 10 disclosed in Japanese Patent Application Laid-Open No. 2002-112256.

Japanese Patent Application Laid-Open No. 2002-112526 discloses a plane motor 20 capable of driving in the direction of two axes, X and Y. The plane motor 20 comprises a movable stage (movable element) 22 having a plurality of magnets 38, and a stator 26 having a group of coils consisting of a plurality of coils 54 corresponding to driving in the X-axis direction and a group of coils consisting of a plurality of coils 56 corresponding to driving in the Y-axis direction. Applying power to appropriate coils 54 (or 56) arranged opposite to the plurality of magnets 38 enables generation of a Lorentz force in the X-axis (or Y-axis) direction on the movable stage 22. By controlling the amount of power application, the movable stage 22 can be driven in two-dimensional directions. Note that two layers of coils 54 are provided in the Z-axis direction as coils corresponding to driving in the X-axis direction, and two layers of coils 56 are provided in the Z-axis direction as coils corresponding to driving in the Y-axis direction.

Shown in FIGS. 5A and 5B are a top view and a sectional side view of a plane motor having another construction. Shown in FIG. 6 is an enlarged view of the part A shown in FIG. 5B.

The plane motor shown in FIGS. 5A, 5B and 6 comprises a stator 10, and a movable element 20 having a magnet array 21 consisting of a plurality of magnets fixed under the plane stage top board 22. The stator 10 is configured with four layers of coil arrays 1 to 4. From the top layer, the first-layer coil array 1 is provided for driving in the X-axis direction or ωx-axis direction. The respective coil arrays are arranged in the space (refrigerant channel F) between a base 6 and a partition 7. In the space between the base 6 and the partition 7, refrigerant is introduced from a refrigerant inlet 8 in the upstream portion and emitted from a refrigerant outlet 9 in the downstream portion.

Herein, the respective layers of coil arrays are spaced at constant intervals in view of the refrigeration efficiency. Furthermore, as shown in FIGS. 7A and 7B, since the magnet array 21 of the movable element 20 is asymmetrical, even when all the coil arrays are provided as long coils, it is possible to generate a moment of force in the movable element by appropriately selecting the coil arrays to be energized. Also, by appropriately applying power to respective coil arrays, the movable element can be controlled in the rotational direction. Note that "long" in the long coils means that the effective length of the coils is larger than the magnet array 21 arranged in the movable element as shown in FIGS. 5A and 5B, and "short" means that the effective length of the coils is smaller (shorter) than the magnet array arranged in the movable element 22, as with the first-layer coil array shown in FIG. 10.

In general, the larger the space (magnetic gap) between the magnets 38 of the movable element 22 and the coil array 54 (56) of the stator, the smaller the magnetic flux density. Therefore, in the construction shown in FIG. 10, the magnetic flux density in the neighborhood of the coil array 56 provided for driving in the Y-axis direction, which has a relatively larger magnetic gap, is smaller than the magnetic flux density in the neighborhood of the coil array 54 provided for driving the X-axis direction. For this reason, the Lorentz force (i.e., driving force constant) obtained in a case in which the same amount of current is applied to the respective coil arrays is smaller in the Y-axis driving than the X-axis driving. Since an ordinary positioning apparatus requires an equal driving force in the X-axis direction and the Y-axis direction, the heat generation amount of coil array 56 for Y-axis driving is larger than that of the coil array 54 for X-axis driving.

FIG. 8 is a graph showing a trend of a driving force constant corresponding to the magnetic gap of coils, assuming a case wherein each coil array has an equal conductive area of a section having a normal in the coil winding direction. As shown in the graph, the larger the distance between the coils and the magnets (i.e., the larger the magnetic gap of the coils), the smaller the driving force constant of the coils. This trend become more significant as the magnetic gap becomes smaller. In other words, although two layers of coil arrays are provided in FIG. 10, it is supposed that the driving force constant of the coil array 56 for Y-axis driving, which is arranged in the lower layer having a large magnetic gap, is considerably smaller than the driving force constant of the coil array 54 for X-axis driving. Furthermore, when an equal driving force is to be generated, since the heat generation amount of coils is inversely proportional to a square of the driving force constant, it is supposed that the heat generation amount of the coil array 56 for Y-axis driving becomes extremely larger compared to that of the coil array 54 for X-axis driving. From the aspect of coil refrigeration, heat of coils that are positioned with a large magnetic gap often becomes a problem.

Furthermore, when coils are provided in multiple layers, as shown in FIG. 6, the difference in the driving force constant is even larger between the highest-layer coil array 1 and the lowest-layer coil array 4. In a case wherein inert refrigerant is provided from the refrigerant inlet 8 to the outlet 9 to directly cool down the entire coil arrays, as shown in FIGS. 5A, 5B and 6, it is necessary to determine the amount and temperature of the refrigerant in accordance with the lowest-layer coil array 4, which has the largest heat generation amount.

The above-description is summarized. Since the plane motor utilizing a Lorentz force has multiple layers of coils in respective driving-axis directions, the magnetic gaps between the magnets and the coil array are different for each driving axis, and the driving force constants of respective driving axes largely differ. In other words, the larger the magnetic gap of the coil array driven in a driving axis, the worse the driving efficiency. As a result, heat generation becomes unbalanced, i.e., while the upper-layer coil array (small magnetic gap) does not cause much heat generation, the lower-layer coil array (large magnetic gap) causes extremely large heat generation. Moreover, in a case of refrigerating the entire coil arrays by refrigerant, because the amount and temperature of the refrigerant are determined in accordance with the coil array causing the largest heat generation amount, a large amount of refrigerant is wastefully supplied to the upper-layer coil array, and an extremely large amount of refrigerant becomes necessary for the stator as a whole.

Therefore, in the plane motor utilizing a Lorentz force, eliminating the unbalanced heat generation in the respective layers of coil arrays, as well as improvement of driving efficiency, are desired from the aspect of efficient coil generation.

SUMMARY OF THE INVENTION

In order to solve the above-described problems and to achieve the object, the present invention provides a stage apparatus comprising a movable element including a plurality of magnets, a stage fixed to the movable element, and a stator configured with layers of coils arranged opposite to the magnets with a gap, respective layers of coils serving as a plurality of driving axes for driving the movable element in two-dimensional directions, the stage apparatus generating a driving force in the movable stage by applying power to coils corresponding to respective layers, wherein a conductive area of a section having a normal in a coil winding direction is made so that heat generation amounts of coils corresponding to the respective layers are substantially equal.

In the above-described apparatus, the conductive area of the section having a normal in the coil winding direction in respective layers of coils is made relatively larger than coils having a driving force constant.

Furthermore, the present invention provides a stage apparatus comprising a movable element including a plurality of magnets, a stage fixed to the movable element, and a stator configured with layers of coils arranged opposite to the magnets with a gap, respective layers of coils serving as a plurality of driving axes for driving the movable element in two-dimensional directions, the stage apparatus generating a driving force in the movable stage by applying power to coils corresponding to respective layers, wherein a conductive area of a section having a normal in a coil winding direction is made in accordance with a magnetic gap between the magnets and the respective layers of coils.

In the above-described apparatus, the conductive area of the section having a normal in the coil winding direction in respective layers of coils is made relatively larger than coils having a small magnetic gap.

Moreover, in the above-described apparatus, the conductive area of the section having a normal in the coil winding direction is changed by altering a thickness of predetermined coils.

Moreover, in the above-described apparatus, wherein the conductive area of the section having a normal in the coil winding direction is changed by dividing predetermined coils in a thickness direction.

Furthermore, the present invention provides a stage apparatus comprising a movable element including a plurality of magnets, a stage fixed to the movable element, and a stator configured with layers of coils arranged opposite to the magnets with a gap, respective layers of coils serving as a plurality of driving axes for driving the movable element in two-dimensional directions, the stage apparatus generating a driving force in the movable stage by applying power to coils corresponding to respective layers, wherein a surface area of the coils is made in accordance with a heat generation amount of the respective layers of coils or a magnetic gap between the respective layers of coils and the magnets.

In the above-described apparatus, the surface area of predetermined coils is made relatively larger than coils having a small heat generation amount or coils having a small magnetic gap to the magnets.

Moreover, in the above-described apparatus, the surface area of coils is made by dividing predetermined coils in a thickness direction.

Additionally, the present invention provides a stage apparatus comprising a stator including a plurality of coil arrays, a stage movable along the stator, and a magnet array provided on the stage, wherein a sectional area of the respective coil array is different in accordance with a distance to the magnet.

The present invention also provides a stage apparatus comprising a stator including a plurality of coil arrays, a stage movable along the stator, and a magnet array provided on the stage, wherein a sectional area of the respective coil array is different in accordance with a driving force constant when moving the stage by applying power to the respective coil array.

Furthermore, the present invention is also applicable to an exposure apparatus, comprising the stage apparatus having any of the above-described constructions, which exposes an original pattern on a substrate by relatively scanning the original and the substrate by the stage apparatus, or to a device manufacturing method for manufacturing a semiconductor device utilizing the exposure apparatus.

Still further, the present invention is also applicable to a plane motor by excluding the stage from the above-described construction.

As described above, according to the present invention, it is possible to reduce unevenness in the coil heat generation amount in each driving axis, and to design the apparatus in a way to make uniform the driving efficiency. Accordingly, it is possible to solve the conventional problems of difficulties in refrigeration due to heat generation in the lowest-layer coils.

Furthermore, by virtue of reducing the unevenness in the heat generation amount, in a case of a configuration wherein the entire coils are refrigerated as a whole, it is possible to perform efficient refrigeration without waste, and to reduce the size of the overall apparatus related to refrigeration.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 8 is a graph showing a trend of the relation between a driving force constant of each coil array and a magnetic gap;

DETAILED DESCRIPTION OF THE PREFERRED EMBODIMENTS

Hereinafter, preferred embodiments of the present invention will be described in detail with reference to the accompanying drawings.

First Embodiment

Figure 1:
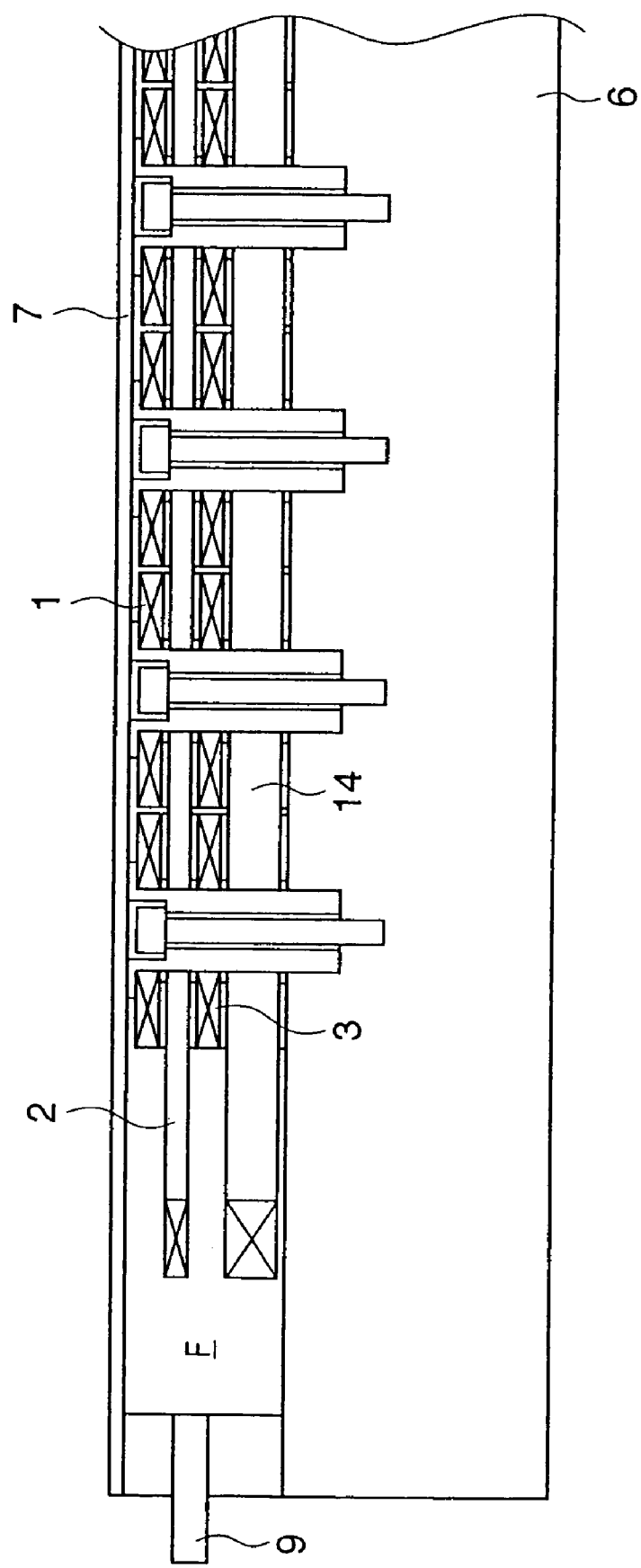
FIG. 1 is a cross section of a stator exemplifying a construction of coil arrays according to the first embodiment.

FIG. 1 is a cross section of a stator exemplifying a construction of coil arrays according to the first embodiment.

As an embodiment of changing the conductive area of a section having a normal in the coil winding direction in accordance with the heat generation amount in each layer of coils, according to the construction of the first embodiment, the conductive area of a section having a normal in the coil winding direction is made larger in the coil array causing a large heat generation amount than that of the coil array causing a small heat generation amount.

Figure 5A:
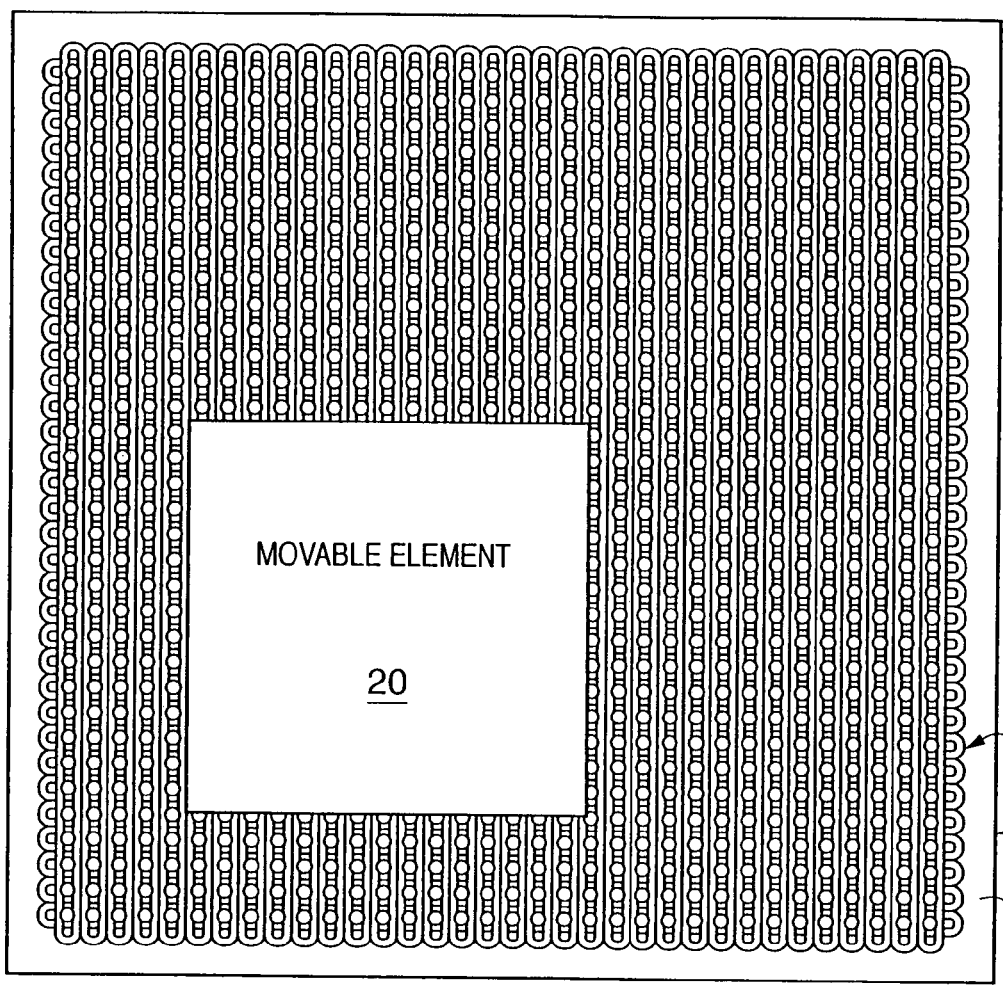
FIGS. 5A and 5B are respectively a plan view and a sectional side view showing a construction of a conventional plane motor.
Figure 5B:
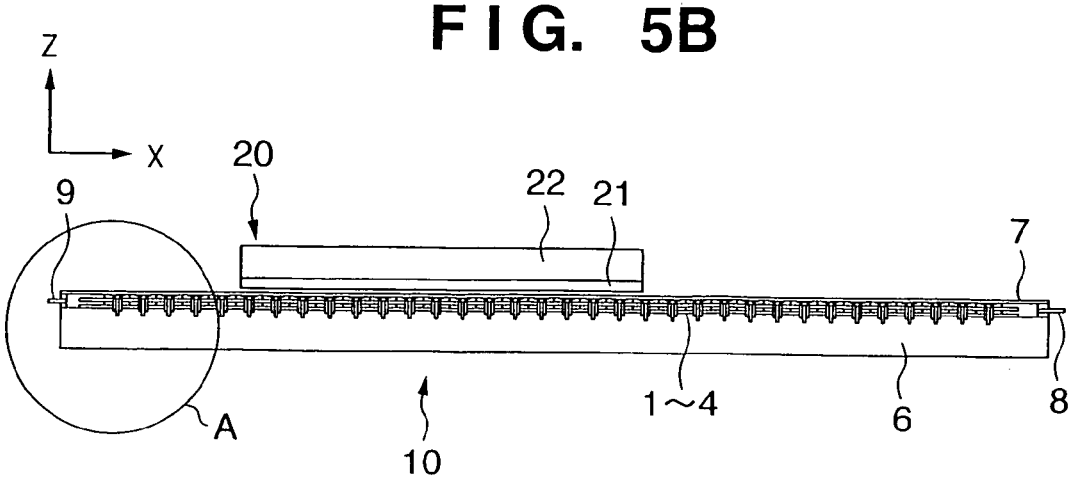
Figure 6:
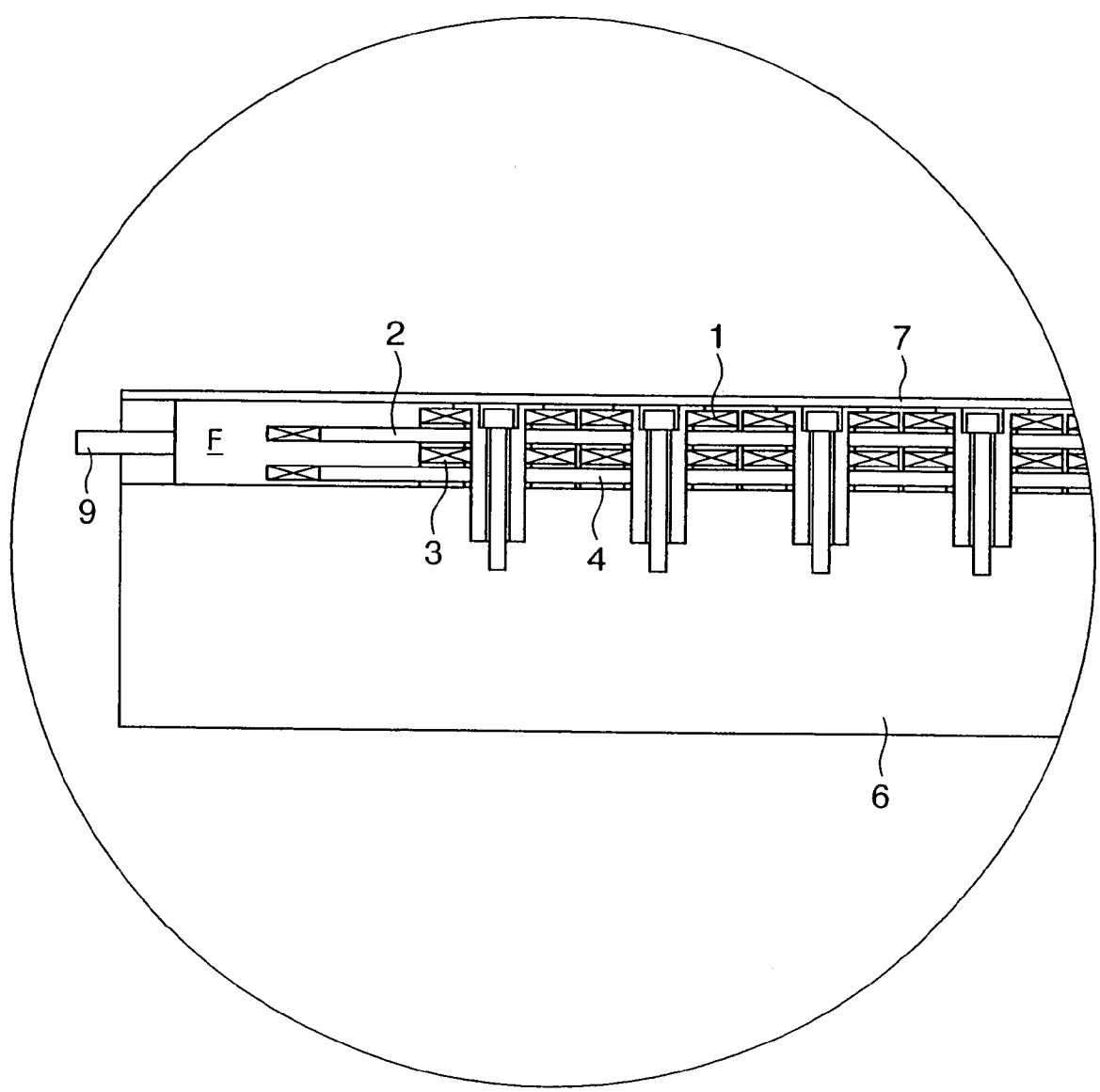
FIG. 6 is an enlarged view of part A shown in FIG. 5B.

More specifically, based on the construction shown in FIGS. 5A, 5B and 6, the coil thickness of the fourth-layer coil array 14 corresponding to Z-axis or ωx-axis driving is made twice as thick. As shown in FIG. 8, in a case in which each coil array has an equal conductive area of a section having a normal in the coil winding direction, the lower the layer of coil array, the smaller the driving force constant, i.e., the worse the coil efficiency. Therefore, it can be assumed that the fourth-layer coil array most likely causes the largest heat generation and that it can become a problem from the aspect of refrigeration. In order to deal with this problem, the coil thickness of the fourth-layer coil array 14 is increased to raise the driving force constant in the fourth-layer coil array.

For instance, when the coil thickness of the fourth-layer coil array 14 is made twice as thick, the driving force obtained by a certain current is doubled, in other words, the driving force constant can be doubled. Although the coil resistance is also doubled from the aspect of heat generation per coil, since the driving force constant is doubled, the heat generation is reduced in half. In other words, the amount of refrigeration is halved. As a matter of course, the coil thickness of the third-layer coil array 3 may also be increased in the similar manner. However, if the third-layer coil array 3 is thickened, the upper coil end of the fourth-layer coil array 14 is substantially deviated toward the lower layer, resulting in an increased apparent magnetic gap of the fourth-layer coil array 14. As a result, while the heat generation of the third-layer coil array 3 is reduced, the heat generation of the fourth-layer coil array 14 is increased.

Therefore, in a case of increasing the coil thickness of the upper-layer coil arrays 1 to 3, it is necessary to further increase the thickness of the fourth-layer coil array 14 to compensate for the substantially increased magnetic gap of the fourth-layer coil array so that heat generation unevenness in respective coil arrays is reduced. Alternatively, it is necessary to design the apparatus in a way that the maximum heat generation in respective coil arrays is reduced.

Figure 7A:
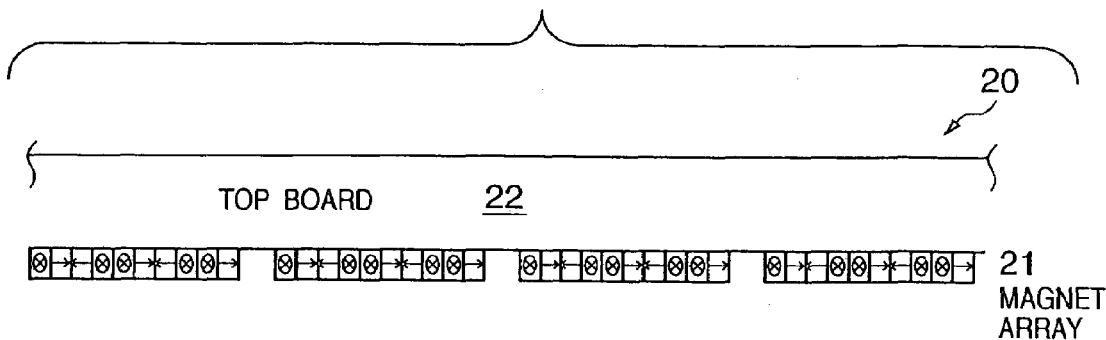
FIGS. 7A and 7B are respectively a side view and a rear view showing a magnet arrangement of a movable element constituting the conventional plane motor.
Figure 7B:
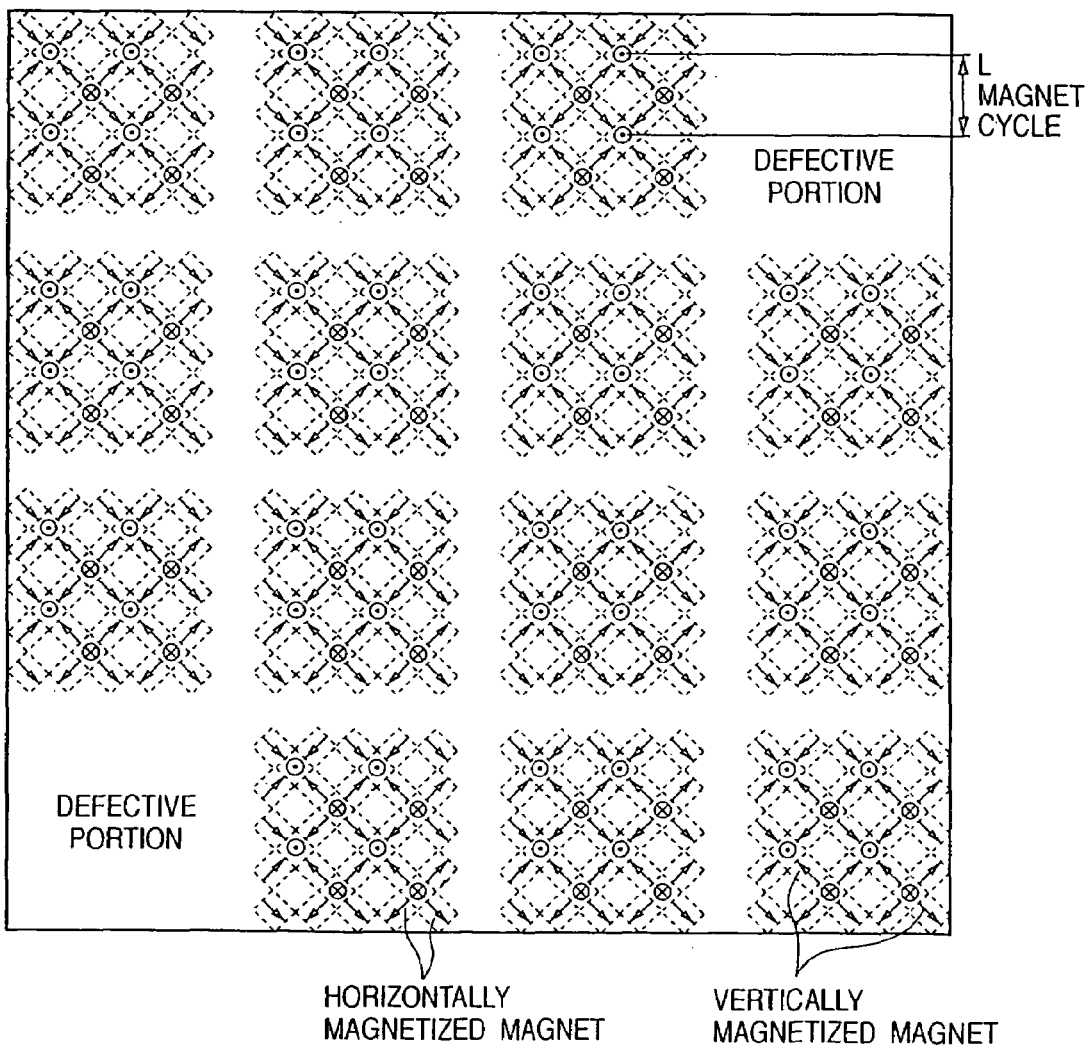
Figure 9:
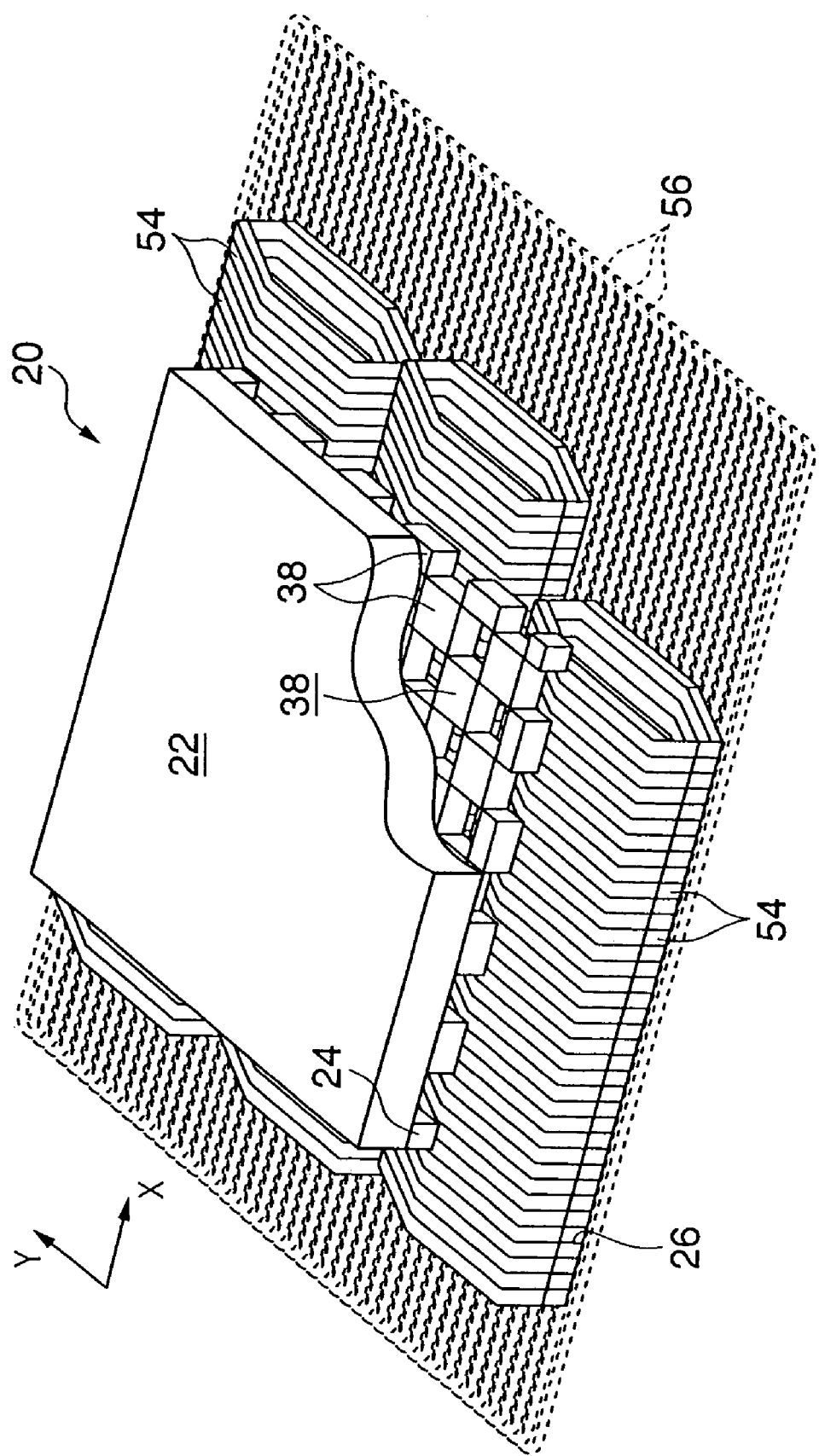
FIG. 9 is a perspective partially cutaway view showing a construction of the conventional plane motor.
Figure 10:
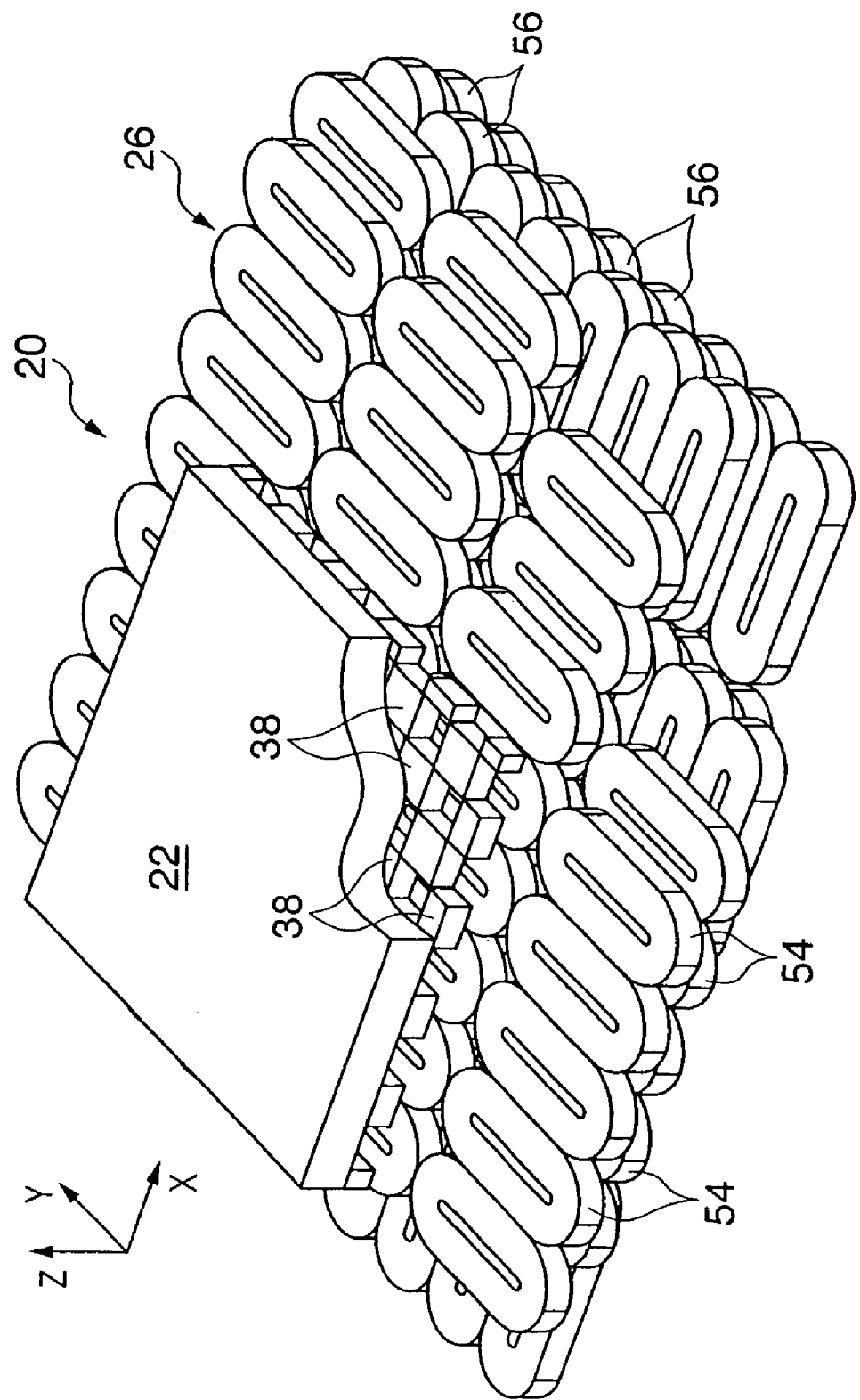
FIG. 10 is a perspective partially cutaway view showing a construction of the conventional plane motor.

Note that Japanese Patent Application Laid-Open No. 2002-112526 discloses, an example as shown in FIG. 9, in which the coil configuration of the first-layer coil array is different from that of the second-layer coil array. One may argue that the conductive area of the coil section is substantially changed, although it is not intended. However, the reason for changing the coil configuration in the first layer and the second layer in Japanese Patent Application Laid-Open No. 2002-112526 is as follows. That is, since the magnet arrangement is not asymmetrical, as shown in FIGS. 7A and 7B, in order to add the function for applying a rotational force to the movable element 22, a long coil 56 cannot be used for both the first and second layers of coil arrays, but a short coil 54 has to be used for one of the coil arrays. In other words, in a case where the magnet arrangement is not asymmetrical, as shown in FIG. 7, mere layering of long coil arrays, as shown in FIGS. 5A and 5B, does not realize generation of a driving force in the rotational direction (with respect to the Z axis) in the movable element 22. Instead, it is necessary to provide short coils to the coil array corresponding to one of the driving axis X or Y, and to arrange energized and non-energized short coils opposite to the magnets, thereby applying asymmetrical electromagnetic force (moment of force) to the barycenter of the movable element. Furthermore, because Japanese Patent Application Laid-Open No. 2002-112526 includes no description as to the distance between the magnets and respective layers of coil arrays, i.e., a magnetic gap, or has no description as to changing the coil configuration to reduce the heat generation amount in the coils, it is apparent that Japanese Patent Application Laid-Open No. 2002-112526 is largely different from the import of the present invention.

Second Embodiment

Figure 2:
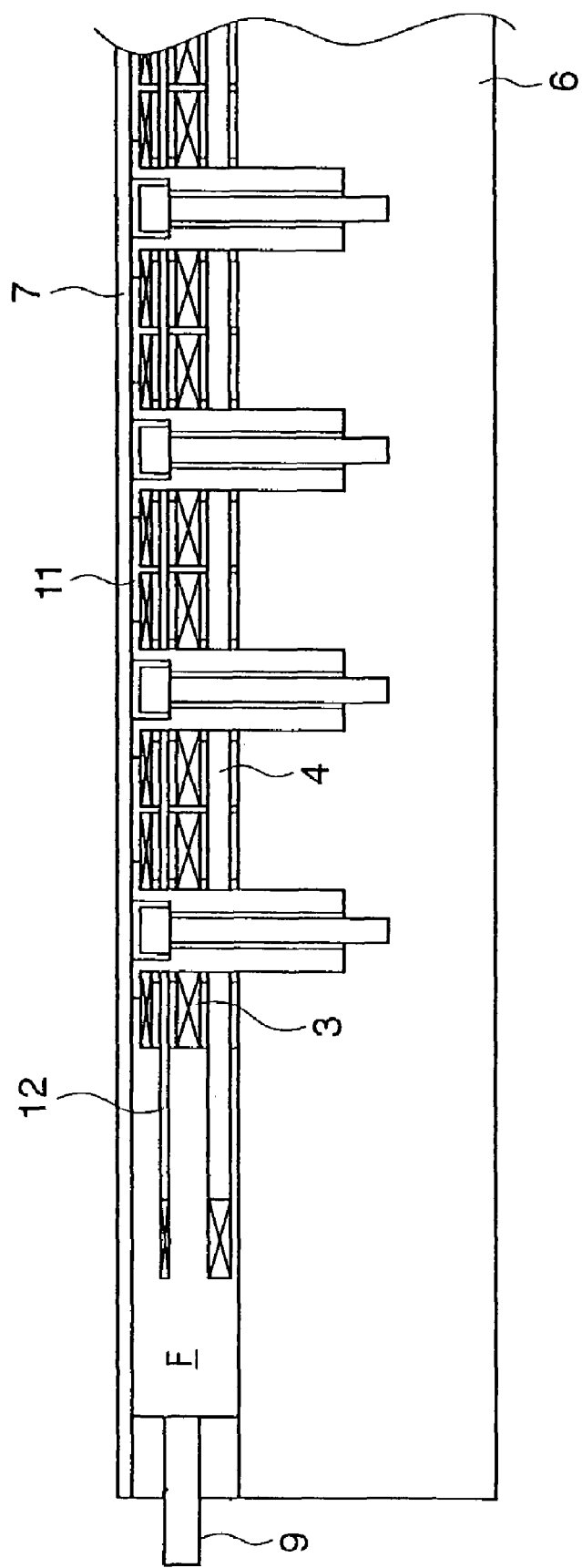
FIG. 2 is a cross section of a stator exemplifying a construction of coil arrays according to the second embodiment.

FIG. 2 is a cross section of a stator exemplifying a construction of coil arrays according to the second embodiment.

As an embodiment of changing the conductive area of a section having a normal in the coil winding direction in accordance with the magnetic gap between magnets and respective layers of coil arrays, according to the construction of the second embodiment, the coil thickness is changed so that the conductive area of a section having a normal in the coil winding direction in respective layers of coils is made larger relative to that of the coil array having a small magnetic gap.

More specifically, based on the construction shown in FIGS. 5A, 5B and 6, the coil thickness of the upper-layer coil arrays 11 and 12 is reduced, in contrast to FIG. 1, to deviate as a whole the lower layers of coils toward the upper layer, so that the substantial magnetic gap of the lower-layer coil arrays 3 and 4 is reduced, the driving force constants are increased, and the heat generation amount of the coils is reduced. More specifically, in FIG. 2, the thickness of the first- and second-layer coil arrays 11 and 12 is cut in half from the thickness shown in FIG. 6. Accordingly, in the first layer coil array 11, while the driving force constant is reduced in half in proportion to the reduced conductive area of the coil section, since the coil resistance is reduced in half, the heat generation amount of the coils is doubled. However, since the driving axis corresponding to the first-layer coil array 11 has a small magnetic gap, it has an extremely high driving force constant higher than other driving axes. Therefore, the increase in the heat generation amount is often a tolerable level. Assuming that the space between respective coil layers is unchanged in view of refrigeration, since the coil thickness is reduced, the overall position of the second and following layers of coils is shifted toward the upper layer, enabling an increase in the overall driving force constants. In this example, since the thickness of the second-layer coil array is also reduced, at least the heat generation amount of the second-layer coil array 12 will not be more than doubled, although it depends upon the influence of reduced coil thickness and the influence of the overall coil position being shifted toward the upper layer. In the case of the second-layer coil array 12 also, the tolerance of the increased heat generation amount is often greater than the third- and fourth-layer coil arrays 3 and 4. If anything, reducing the thickness of the first- and second-layer coil arrays 11 and 12 more likely brings about an effect of suppressing the overall heat generation, because the third- and fourth-layer coil arrays 3 and 4 are shifted toward the upper layer. Moreover, approximating the heat generation amount of the first- to-fourth-layer coil arrays by increasing the heat generation amount of the first- and second-layer coil arrays and decreasing the heat generation amount of the third- and fourth-layer coil arrays is preferable, since it suppresses unevenness in the heat generation amount of coil arrays corresponding to respective driving axes.

Third Embodiment

As an embodiment of changing the conductive area of a section having a normal in the coil winding direction in accordance with the magnetic gap between magnets and respective layers of coil arrays, according to the construction of the third embodiment, the coil array is divided in the coil thickness direction so that the conductive area of a section having a normal in the coil winding direction in respective layers of coils is made larger relative to that of the coil array having a small magnetic gap.

More specifically, based on the construction shown in FIGS. 5A, 5B and 6, the coil array corresponding to driving the Z-axis or ωx-axis direction is divided into two layers including the fourth-layer coil array 24 and the fifth-layer coil array 15. In other words, while one layer of the coil array is provided for one direction with respect to other driving axes, two layers of coil arrays are provided for driving in the Z-axis or ωx-axis direction, thereby increasing the conductive area of the coil section for the Z-axis or Cox-axis driving. Accordingly, the apparent driving force constant for this driving axis is doubled. It corresponds to doubling the surface area of the coil arrays 24 and 25 corresponding to the driving axis. In other words, it is an extremely effective construction, because not only is the heat transmission surface of the refrigerant doubled to reduce the heat generation amount per coil, but also, refrigeration efficiency is improved. However, similar to other constructions, this construction is extremely effective if applied to the lowest layer of coil array, but if applied to other layers besides the fourth layer, it is necessary to design the apparatus taking an increased heat generation amount into consideration, since the coil position of the fourth-layer coil array is shifted toward the lower layer.

Fourth Embodiment

Figure 4:
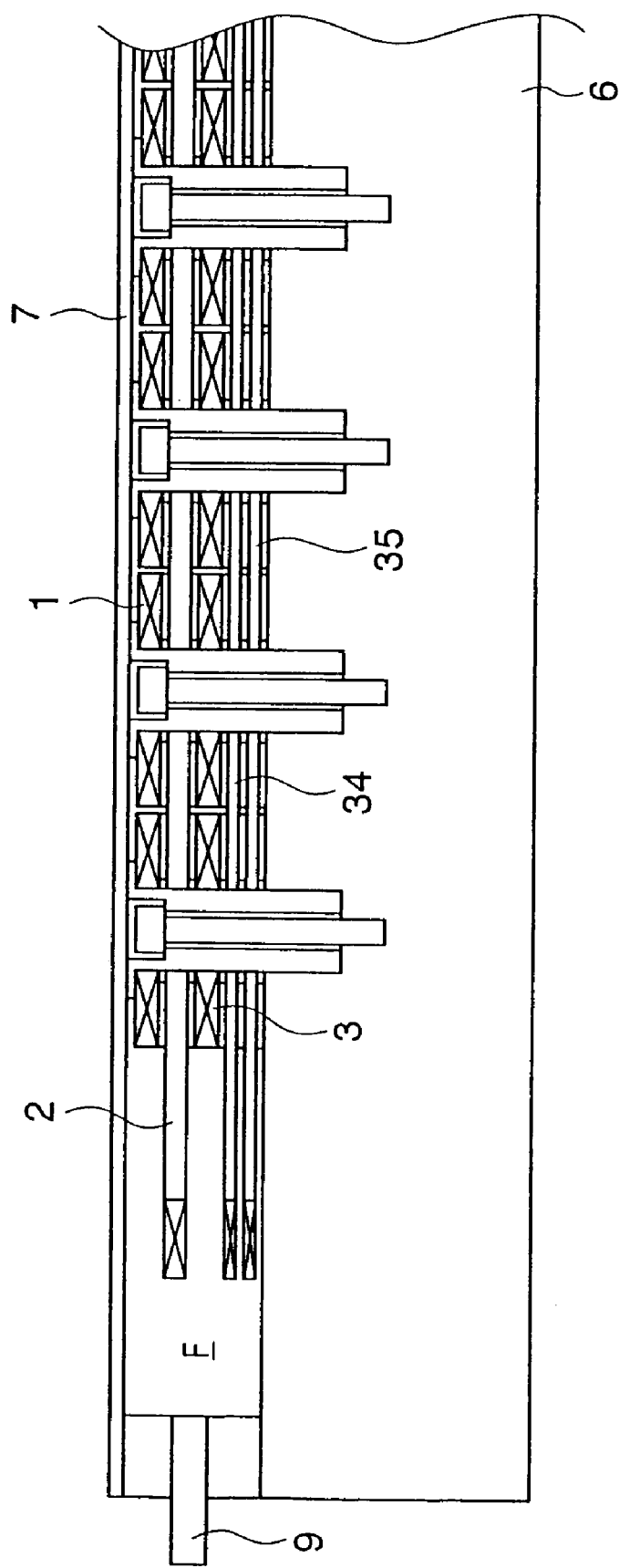
FIG. 4 is a cross section of a stator exemplifying a construction of coil arrays according to fourth embodiment.

FIG. 4 is a cross section of a stator exemplifying a construction of coil arrays according to the fourth embodiment.

As an embodiment of changing a coil surface area in accordance with the heat generation amount of respective layers of coils, according to the construction of the fourth embodiment, the coil array is divided in the coil thickness direction so that the coil surface area is made larger relative to that of the coil array having a small heat generation amount.

Figure 3:
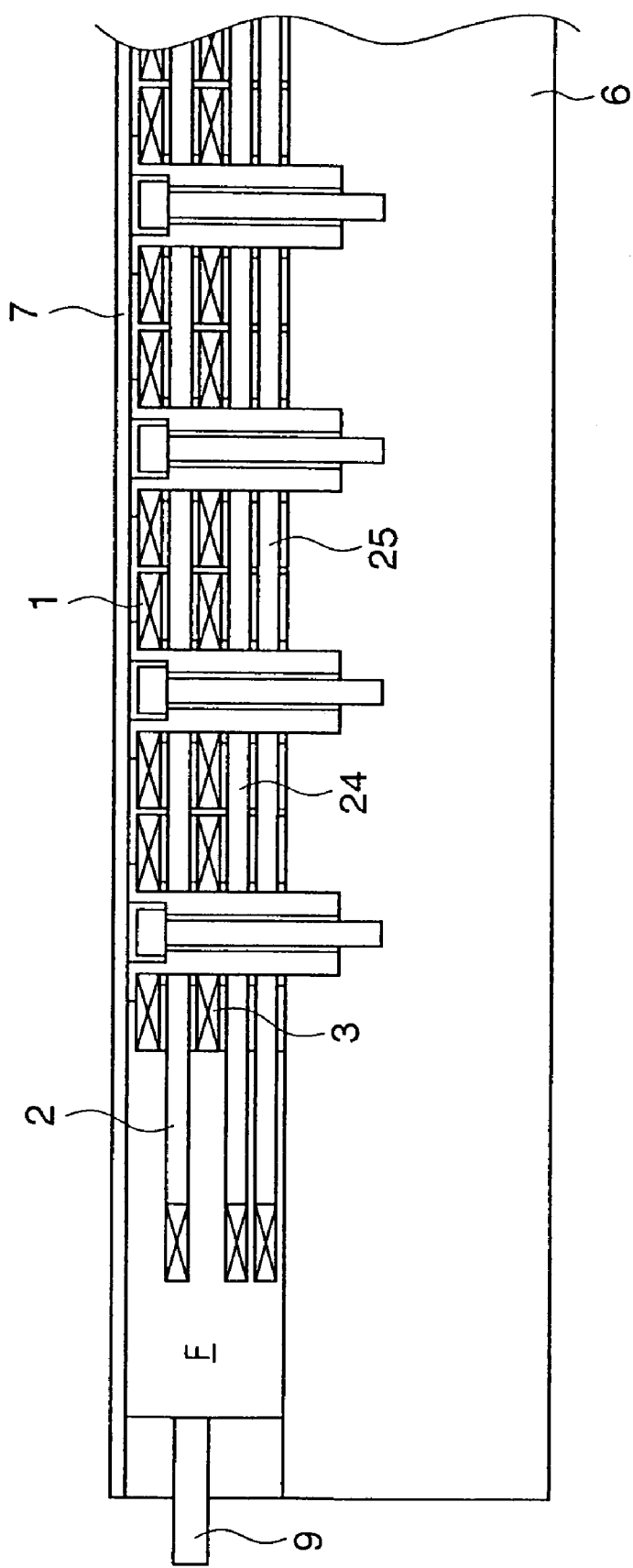
FIG. 3 is a cross section of a stator exemplifying a construction of coil arrays according to the third embodiment.

More specifically, based on the construction shown in FIGS. 5A, 5B and 6, the coil array corresponding to driving in the Z-axis or ωx-axis direction is divided into two layers including the fourth-layer coil array 34 and the fifth-lay coil array 35, and the thickness of the coil arrays 34 and 35 is set to be half the thickness of the other upper-layer coil arrays 1 to 3. The fourth embodiment differs from the construction shown in FIG. 3 in that the conductive area of the coil section for driving in the Z-axis or ωx-axis direction is unchanged. In other words, this embodiment is not purposed to reduce heat generation of the lowest layer of coil array corresponding to driving the Z-axis or ωx-axis direction, which presumably produces the largest heat generation amount, but to increase the surface area of the coil array to enlarge the contact area of refrigerant and to improve refrigeration efficiency so as to optimize overall refrigeration. In this construction, since dividing the coil array causes the addition of a refrigerant channel (space between coil layers) to the magnetic gap, if this construction is applied to other layers besides the lowest layer, the heat generation amount in the lower-layer coil arrays may increase, and the overall refrigeration may not be optimized. Therefore, it is necessary to design the apparatus taking this point into consideration.

[Application to an Exposure Apparatus]

Described next is an example of applying the plane motor according to each of the above-described embodiments to stage driving of a stage apparatus for positioning an object, and incorporating the stage apparatus in an exposure apparatus employed in semiconductor device manufacturing.

Figure 11A:
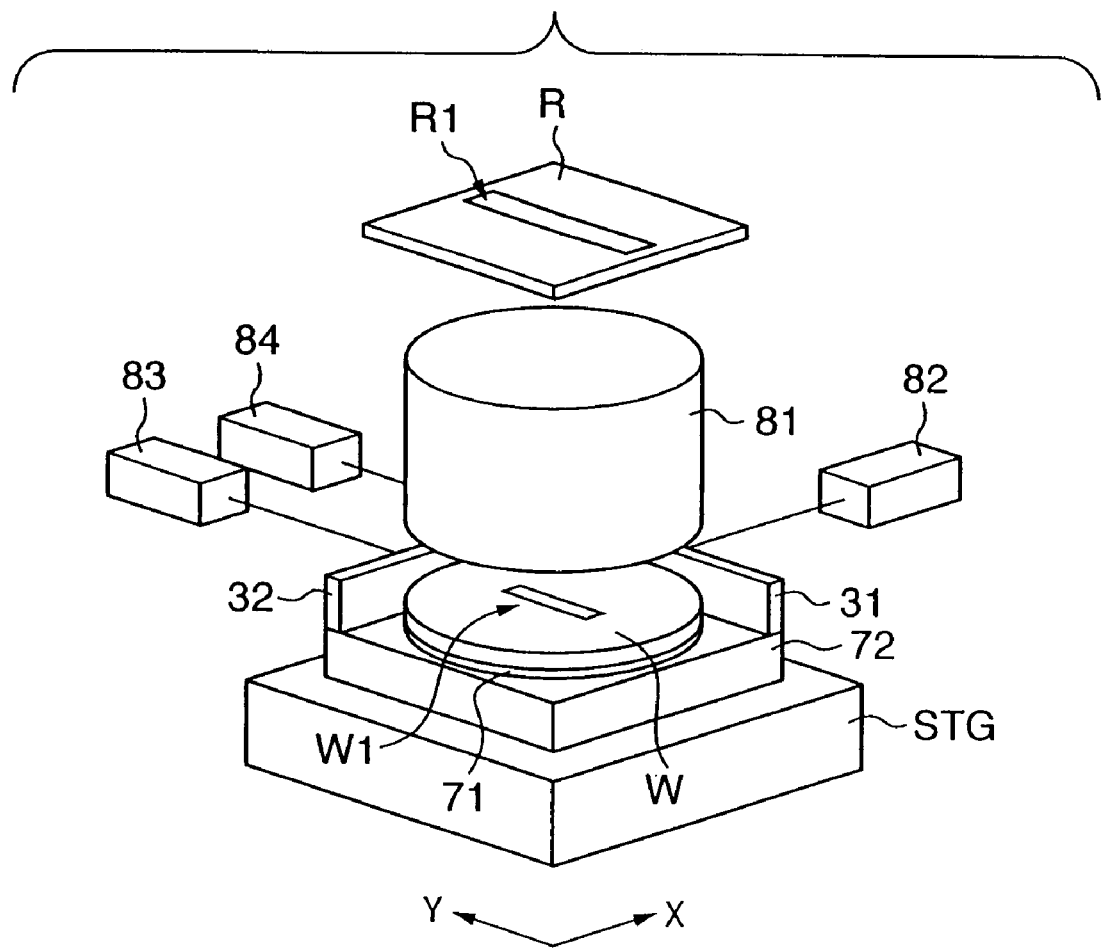
FIGS. 11A and 11B are views showing a brief construction of an exposure apparatus according to an embodiment of the present invention.

As shown in FIG. 11A, an exposure apparatus incorporating a stage apparatus STG having an above-described plane motor comprises a reticle R on which a circuit pattern is rendered, and an illumination optical system 80 for providing illumination light to the slit-like elongated exposure area RI on the reticle R. Part of the rendering pattern on the exposed reticle R is transferred to the wafer W through a projection lens 80 serving as a projection optical system.

Furthermore, the exposure apparatus comprises a wafer stage 72 holding the wafer W, which is capable of moving on the XY plane that is orthogonal to an optical axis of the projection lens 81, a chuck table 71 for holding the wafer 2 on the wafer stage 72, laser interferometers 82, 83 and 84 for detecting a position and posture of the wafer stage 72, and reflection mirrors 31 and 32 fixed to the wafer stage 72. On the wafer W, a slit-like elongated shot W1 is transferred.

As long as the reticle R and the wafer W can be relatively scanned, not only a wafer stage, but also, a reticle stage holding the reticle R, which is capable of moving on the XY plane that is orthogonal to the optical axis of the projection lens 81, may be added.

Figure 11B:
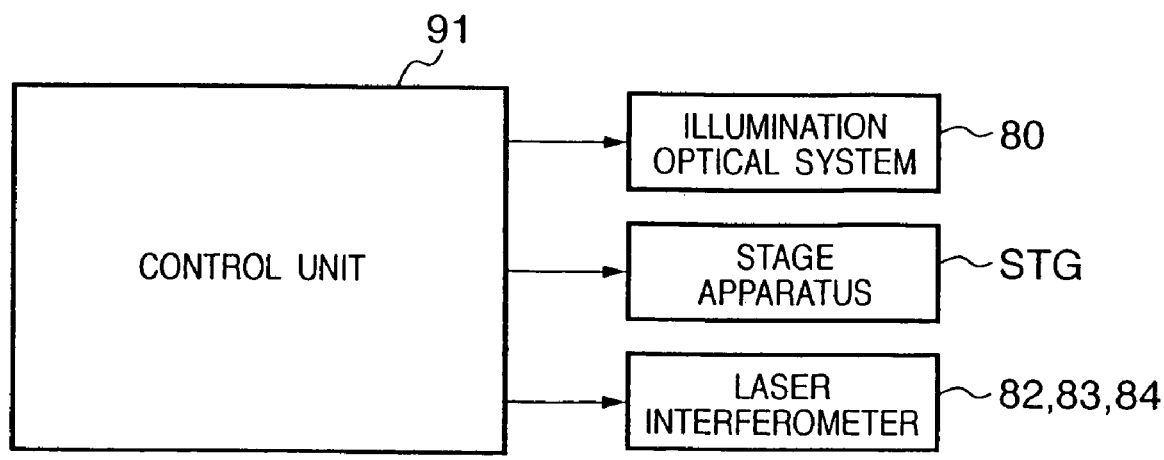

Further, provided in the exposure apparatus is, as shown in FIG. 11B, a control unit 91, which performs operation related to stage moving, exposure, such as irradiation of illumination light, and position compensation control of the aforementioned mass body.

[Device Manufacturing Method]

Next, an embodiment of a device manufacturing method utilizing the aforementioned exposure apparatus is described.

Figure 12:
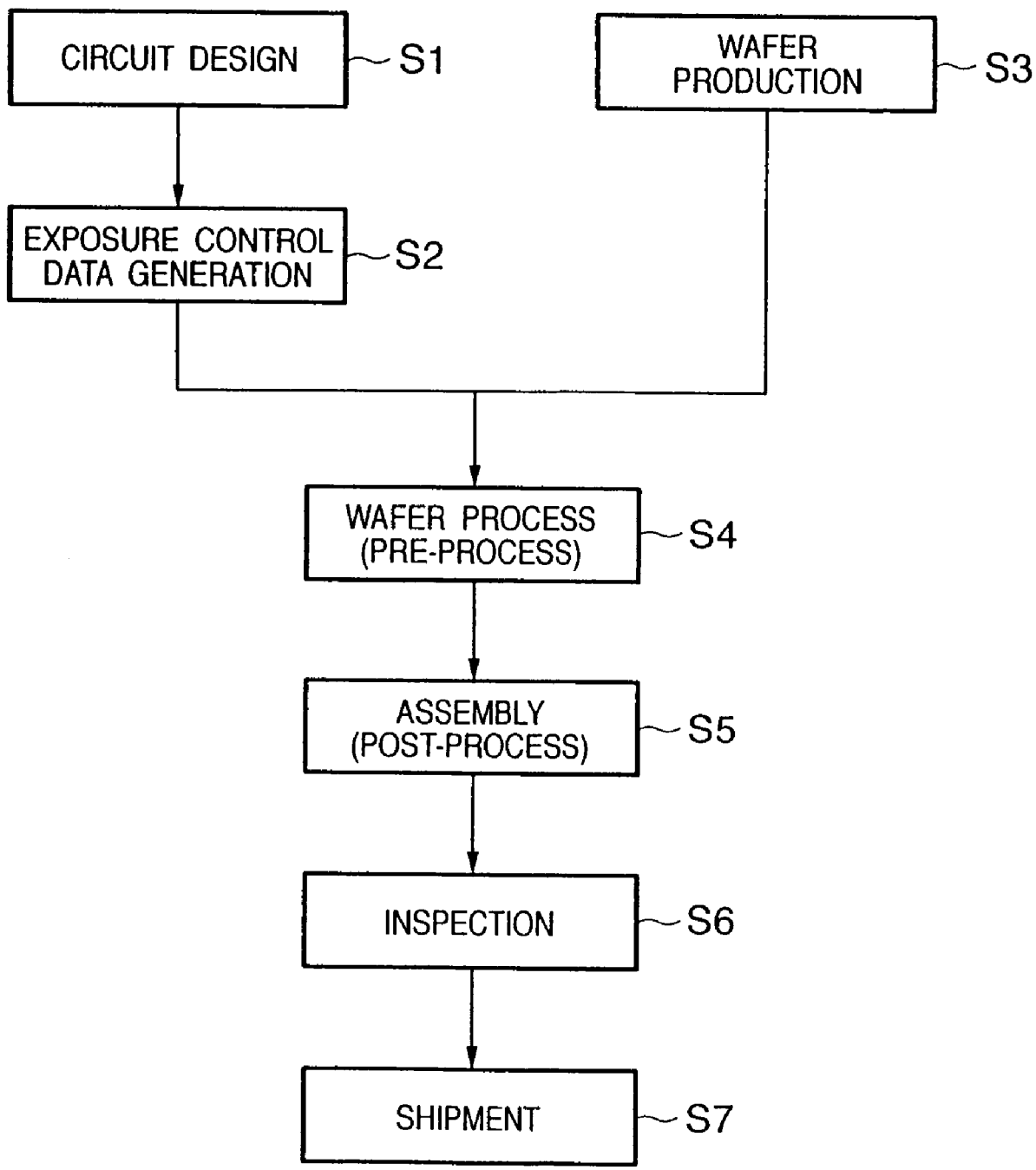
FIG. 12 is a flowchart describing a micro-device manufacturing process.

FIG. 12 shows a manufacturing flow of micro devices (e.g., semiconductor chips such as ICs or LSIs, liquid crystal panels, CCDs, thin-film magnetic heads, micro machines, and so forth). In step S1 (circuit design), a circuit of a semiconductor device is designed. In step S2 (exposure control data generation), exposure control data of the exposure apparatus is generated based on the designed circuit pattern. Meanwhile, in step S3 (wafer production), a wafer is produced with a material such as silicon. In step S4 (wafer process), which is called a pre-process, an actual circuit is formed on the wafer by a lithography technique using the wafer and the exposure apparatus to which the aforementioned exposure control data is inputted. In step S5 (assembly), which is called a post-process, a semiconductor chip is manufactured using the wafer produced in step S4. Step S5 includes an assembling process (dicing and bonding), a packaging process (chip embedding), and so on. In step S6 (inspection), the semiconductor device manufactured in step S5 is subjected to inspection such as an operation-check test, a durability test, and so on. The semiconductor device manufactured in the foregoing process is shipped (step S7).

Figure 13:
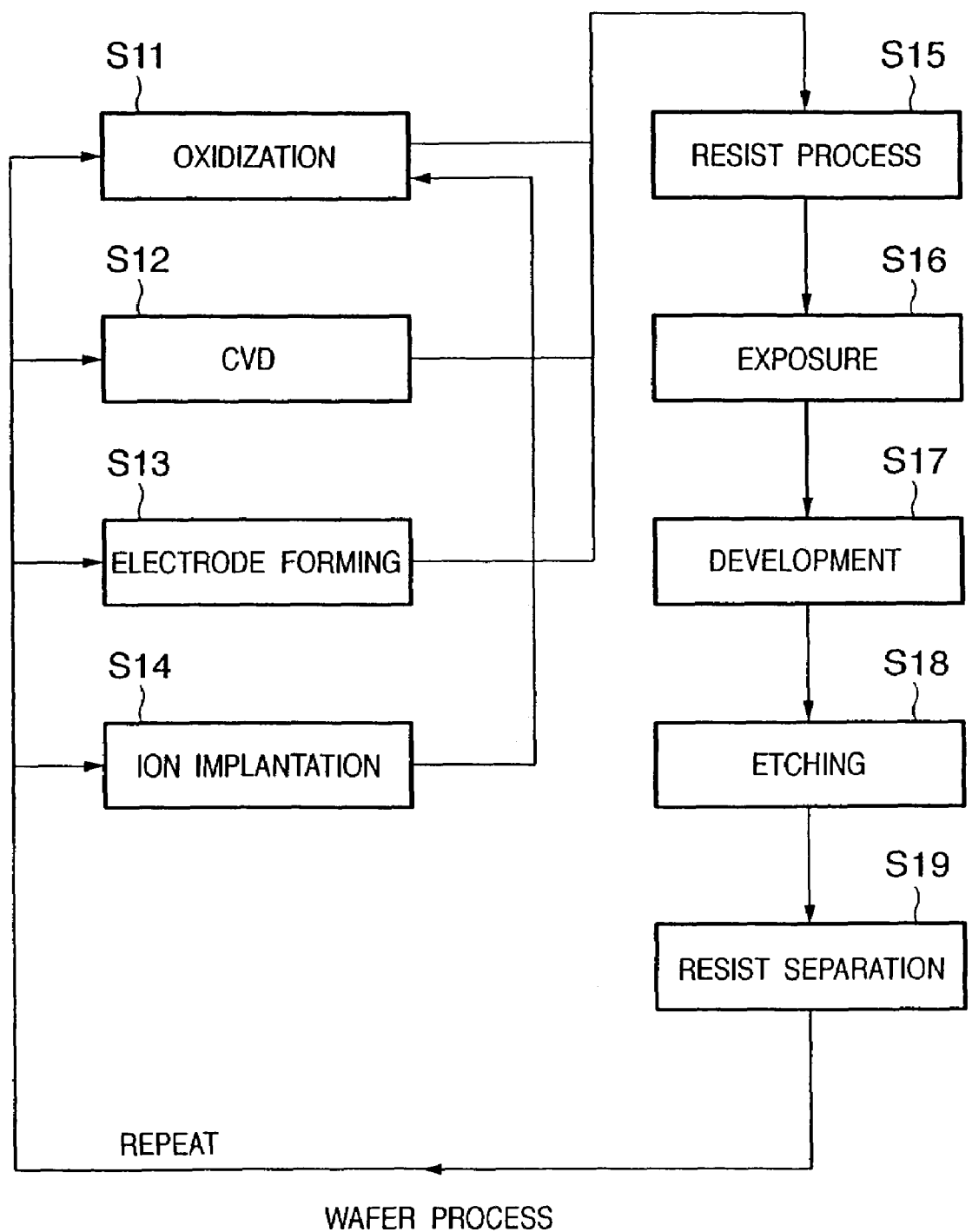
FIG. 13 is a flowchart describing a wafer process.

FIG. 13 shows a flow of the aforementioned wafer process in detail. In step S11 (oxidization), the wafer surface is oxidized. In step S12 (CVD), an insulating film is deposited on the wafer surface. In step S13 (electrode forming), electrodes are deposited on the wafer. In step S14 (ion implantation), ions are implanted on the wafer. In step S15 (resist process), a photosensitive agent is coated on the wafer. In step S16 (exposure), the circuit pattern is exposed on the wafer by the above-described exposure apparatus. In step S17 (development), the exposed wafer is developed. In step S18 (etching), portions other than the developed resist image are removed. In step S19 (resist separation), unnecessary resist upon etching is removed. By repeating the foregoing steps, multiple circuit patterns are formed on the wafer.

By virtue of the manufacturing method of the present embodiment, highly integrated semiconductor devices, which have conventionally been difficult to produce, can be manufactured at low cost.

The present invention is not limited to the above embodiment and various changes and modifications can be made within the spirit and scope of the present invention. Therefore, to apprise the public of the scope of the present invention, the following claims are made.

What is claimed is:

1. A stage apparatus comprising:
a movable element including a plurality of magnets;
a stage fixed to the movable element; and
a stator configured with layers of coils arranged opposite to the magnets with a gap,
wherein (i) respective layers of coils serve as a plurality of driving axes for driving the movable element in two-dimensional directions, (ii) said stage apparatus generates a driving force in the movable stage by applying power to coils corresponding to respective layers, (iii) a conductive area of a section having a normal coil in a coil winding direction is made so that heat generation amounts of coils corresponding to the respective layers are substantially equal, and (iv) the conductive area of the section having a normal in the coil winding direction in the respective layers of coils is made relatively larger than coils having a smaller driving force constant.

2. A stage apparatus comprising:
a movable element including a plurality of magnets;
a stage fixed to the movable element; and
a stator configured with layers of coils arranged opposite to the magnets with a gap,
wherein (i) respective layers of coils serve as a plurality of driving axes for driving the movable element in two-dimensional directions, (ii) said stage apparatus generates a driving force in the movable stage by applying power to coils corresponding to respective layers, (iii) a conductive area of a section having a normal in a coil winding direction is made in accordance with a magnetic gap between the magnets and the respective layers of coils, and (iv) the conductive area of the section having a normal in the coil winding direction in respective layers of coils is made relatively larger than coils having a smaller magnetic gap.

3. An exposure apparatus, comprising the stage apparatus according to claim 1, for exposing an original pattern on a substrate by relatively scanning the original and the substrate by the stage apparatus.

4. A plane motor comprising:
a movable element including a plurality of magnets; and
a stator configured with layers of coils arranged opposite to the magnets with a gap,
wherein (i) respective layers of coils serve as a plurality of driving axes for driving the movable element in two-dimensional directions, (ii) said plane motor generates a driving force in the movable stage by applying power to coils corresponding to respective layers, (iii) a conductive area of a section having a normal in a coil winding direction is made so that heat generation amounts of coils corresponding to the respective layers are substantially equal, and (iv) the conductive area of the section having a normal in the coil winding direction in respective layers of coils is made relatively larger than coils having a smaller driving force constant.

5. A plane motor comprising:
a movable element including a plurality of magnets; and
a stator configured with layers of coils arranged opposite to the magnets with a gap,
wherein (i) respective layers of coils serve as a plurality of driving axes for driving the movable element in two-dimensional directions, (ii) said plane motor generates a driving force in the movable stage by applying power to coils corresponding to respective layers, (iii) a conductive area of a section having a normal in a coil winding direction is made in accordance with a magnetic gap between the magnets and the respective layers of coils, and (iv) the conductive area of the section having a normal in the coil winding direction in respective layers of coils is made relatively larger than coils having a smaller magnetic gap.

6. A stage apparatus comprising:
a stator including a plurality of coil arrays;
a stage movable along a surface of said stator; and
a magnet array provided on said stage and generating a force in cooperation with said plurality of coil arrays,
wherein a sectional area of the respective coil array is different in accordance with a distance to the magnet and a sectional area of a closer coil array to said magnet array is made smaller than a sectional area of a farther coil array to said magnetic array, in the plurality of coil arrays.

7. A stage apparatus comprising:

a movable element including a plurality of magnets;

a stage fixed to the movable element; and a stator configured with layers of coils arranged opposite to the magnets with a gap, wherein (i) respective layers of coils serve as a plurality of driving axes for driving the movable element in two-dimensional directions, (iii) said stage apparatus generates a driving force in the movable stage by applying power to coils corresponding to respective layers, (iii) a conductive area of a section having a normal in a coil winding direction is made so that heat generation amounts of coils corresponding to the respective layers are substantially equal, and the conductive area of the section having a normal in the coil winding direction is changed by altering a thickness of predetermined coils.

8. A stage apparatus comprising:

a movable element including a plurality of magnets;

a stage fixed to the movable element; and a stator configured with layers of coils arranged opposite to the magnets with a gap, wherein (i) respective layers of coils serve as a plurality of driving axes for driving the movable element in two-dimensional directions, (ii) said stage apparatus generates a driving force in the movable stage by applying power to coils corresponding to respective layers, (iii) a conductive area of a section having a normal in a coil winding direction is made so that heat generation amounts of coils corresponding to the respective layers are substantially equal, and (iv) the conductive area of the section having a normal in the coil winding direction is changed by dividing predetermined coils in a thickness direction.

9. A stage apparatus comprising:

a movable element including a plurality of magnets;

a stage fixed to the movable element; and a stator configured with layers of coils arranged opposite to the magnets with a gap, wherein (i) respective layers of coils serve as a plurality of driving axes for driving the movable element in two-dimensional directions, (ii) said stage apparatus generates a driving force in the movable stage by applying power to coils corresponding to respective layers, and (iii) a surface area of predetermined coils is made relatively larger than coils having a smaller heat generation amount or coils having a smaller magnetic gap to the magnets.

10. A stage apparatus comprising:

a movable element including a plurality of magnets;

a stage fixed to the movable element; and a stator configured with layers of coils arranged opposite to the magnets with a gap, wherein (i) respective layers of coils serve as a plurality of driving axes for driving the movable element in two-dimensional directions, (ii) said stage apparatus generates a driving force in the movable stage by applying power to coils corresponding to respective layers, (iii) a surface area of the coils is made in accordance with a heat generation amount of the respective layers of coils or a magnetic gap between the respective layers of coils and the magnets, and (iv) the surface area of the coils is changed by dividing predetermined coils in a thickness direction.

* * * * *